US011209994B2

(12) United States Patent
Kandikonda

(10) Patent No.: US 11,209,994 B2
(45) Date of Patent: *Dec. 28, 2021

(54) SYSTEMS AND METHODS FOR DATA PATH POWER SAVINGS IN DDR5 MEMORY DEVICES

(71) Applicant: Micron Technology, Inc., Boise, ID (US)

(72) Inventor: Ravi Kiran Kandikonda, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/730,792

(22) Filed: Dec. 30, 2019

(65) Prior Publication Data

US 2020/0133525 A1    Apr. 30, 2020

Related U.S. Application Data

(63) Continuation of application No. 15/693,173, filed on Aug. 31, 2017, now Pat. No. 10,552,066.

(51) Int. Cl.
*G06F 3/06* (2006.01)
*G11C 11/4096* (2006.01)
(Continued)

(52) U.S. Cl.
CPC .......... *G06F 3/0625* (2013.01); *G06F 3/0638* (2013.01); *G06F 3/0673* (2013.01);
(Continued)

(58) Field of Classification Search
CPC ...... G06F 3/0625; G06F 12/02; G06F 3/0638; G06F 3/0673; G11C 5/063;
(Continued)

(56) References Cited

U.S. PATENT DOCUMENTS 7,378,993 B1 * 5/2008 MacDonald .......... H03M 5/145
341/50
8,024,642 B2   9/2011 Lastras-Montano
(Continued)

OTHER PUBLICATIONS

"Computer Dictionary," 1994, Microsoft Press, 2nd Edition, p. 218, definition for "interface" (Year: 1994).*
(Continued)

*Primary Examiner* — Charles Rones
*Assistant Examiner* — Tong B. Vo
(74) *Attorney, Agent, or Firm* — Fletcher Yoder, P.C.

(57) ABSTRACT

A memory device includes a data path having a data bus. The memory device further includes a first one-hot communications interface communicatively coupled to the data bus, and a second one-hot communications interface communicatively coupled to the data bus. The memory device additionally includes at least one memory bank, and an input/output (I/O) interface communicatively coupled to the at least one memory bank via the first one-hot communications interface and the second one-hot communications interface, wherein the first one-hot communications interface is configured to convert a first data pattern received by the I/O interface into one-hot signals transmitted via the data bus to the second one-hot communications interface, and wherein the second one-hot communications interface is configured to convert the one-hot signals into the first data pattern to be stored in the at least one memory bank.

20 Claims, 5 Drawing Sheets

(51) Int. Cl.
*G06F 12/02* (2006.01)
*G11C 7/10* (2006.01)
*G11C 11/4072* (2006.01)
*G11C 11/408* (2006.01)
*G11C 11/4076* (2006.01)
*G11C 5/06* (2006.01)

(52) U.S. Cl.
CPC .............. *G06F 12/02* (2013.01); *G11C 5/063* (2013.01); *G11C 5/066* (2013.01); *G11C 7/1072* (2013.01); *G11C 11/4072* (2013.01); *G11C 11/4076* (2013.01); *G11C 11/4087* (2013.01); *G11C 11/4096* (2013.01)

(58) Field of Classification Search
CPC ... G11C 11/4096; G11C 5/066; G11C 7/1072; G11C 11/4087; G11C 11/4076; G11C 11/4072
See application file for complete search history.

(56) References Cited

U.S. PATENT DOCUMENTS

| | | | |
|---|---|---|---|
| 8,982,660 | B2 | 3/2015 | Huang et al. |
| 9,870,325 | B2* | 1/2018 | Bains .................. G06F 13/1684 |
| 2003/0198087 | A1 | 10/2003 | Kinsey et al. |
| 2009/0147882 | A1 | 6/2009 | Rha |
| 2009/0172480 | A1 | 7/2009 | Jeddeloh |
| 2009/0180337 | A1* | 7/2009 | Nakanishi ............ G11C 7/1069 |
| | | | 365/189.08 |
| 2016/0125920 | A1 | 5/2016 | Kim et al. |
| 2016/0329097 | A1* | 11/2016 | Ordentlich ............ G06F 3/0604 |
| 2016/0342539 | A1 | 11/2016 | Bains |
| 2017/0116078 | A1* | 4/2017 | Sharon .................... G06F 3/064 |
| 2018/0358060 | A1* | 12/2018 | Cha ...................... G11C 7/1006 |

OTHER PUBLICATIONS

Taiwan Office Action for TW Application No. 107114134 dated Mar. 17, 2019, pp. 14.
International Search Report for PCT/US2018/027822, dated Aug. 10, 2018, pp. 5.
Taiwan Office Action for TW Application No. 107114134 dated Aug. 21, 2017, pp. 48.

* cited by examiner

SYSTEMS AND METHODS FOR DATA PATH POWER SAVINGS IN DDR5 MEMORY DEVICES

CROSS-REFERENCE TO RELATED APPLICATIONS

The present application is a continuation of U.S. application Ser. No. 15/693,173, entitled "Systems and Methods for Data Path Power Savings in DDR5 Memory Devices," and filed Aug. 31, 2017, now U.S. Pat. No. 10,552,066 which issued on Feb. 4, 2020, the entirety of which is incorporated by reference herein for all purposes.

BACKGROUND

Field of the Present Disclosure

The present disclosure relates to circuitry for memory devices, and more specifically, to systems and methods for power savings that may be used in data paths of a memory device such as a double data rate type five (DDR5) memory device.

Description of Related Art

Random access memory (RAM) devices, such as the ones that may be employed in electrical devices to provide data processing and/or storage, may provide direct availability to addressable data stored in memory circuitry of the device. Certain RAM devices, such as synchronous dynamic RAM (SDRAM) devices may, for example, have multiple memory banks having many addressable memory elements. RAM devices may have also a communications interface that may receive addresses, instructions (e.g., read, write, etc.) for operations that may be associated with those addresses, and data associated with the instructions. Communications circuitry that may process the data and addresses to access the corresponding memory banks. Communication lines, such as data transmission lines or paths, may be used to deliver data to the memory banks, and to retrieve data from the memory banks. The RAM devices may consume different levels of power, for example, based on data patterns that are communicated through the data transmission lines. It would be beneficial to reduce power consumption in the RAM devices.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
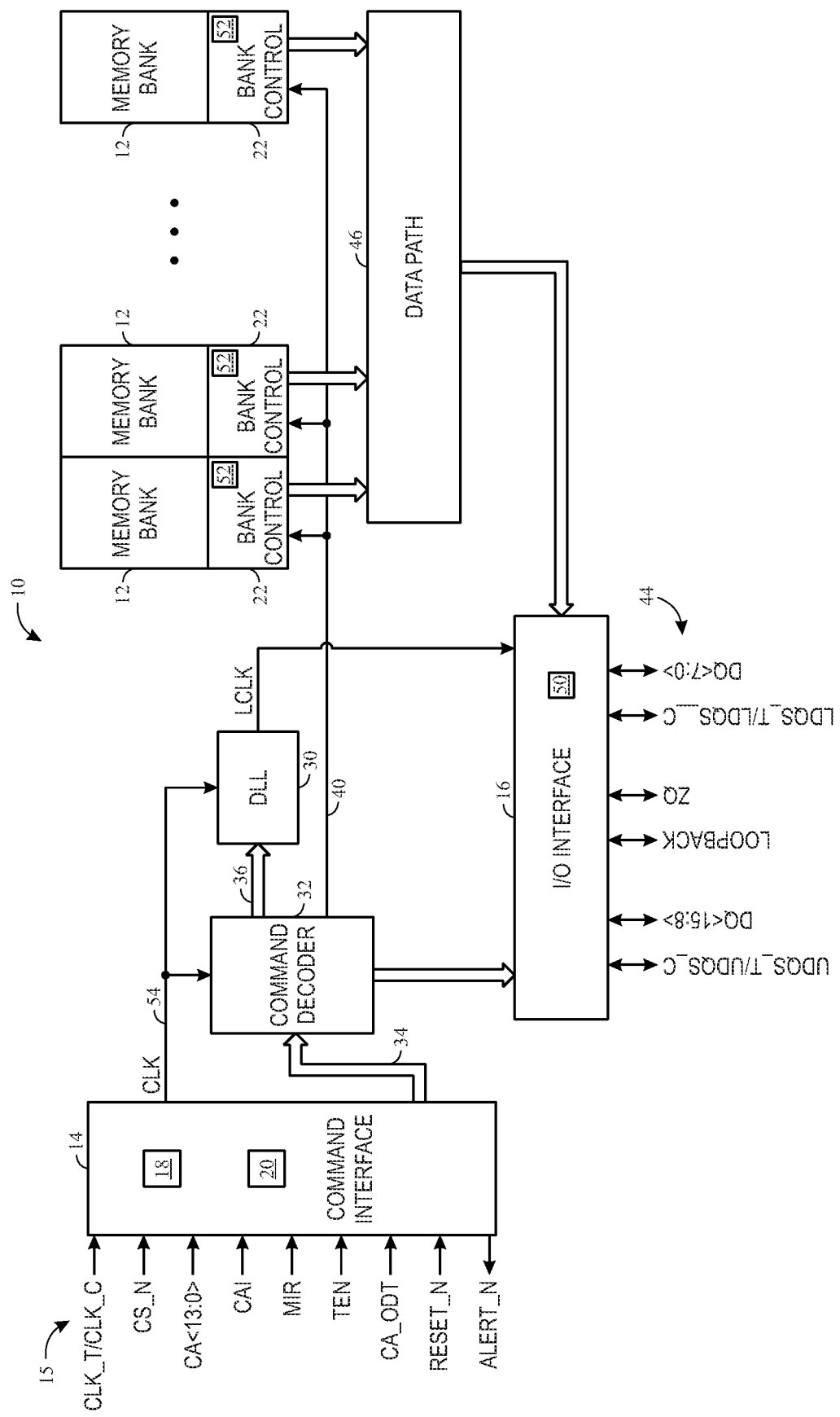
FIG. 1 is illustrating a block diagram illustrating an organization of a memory device and may benefit from improved power consumption, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) memory devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In operation, certain data patterns may use more power during communications. For example, data patterns having more transitions from a binary '1' bit (e.g., bit in a first voltage) to a binary '0' bit (e.g., bit in a second voltage), or vice versa, may use more power than data patterns having less transitions. Further, certain memory devices, such as DDR5 SDRAM, may include data repeaters and other circuitry to "move" data along data paths that may be found in larger die sizes, increasing power consumption for certain of the data patterns having more transitions.

The techniques described herein may reduce the number of transitions (e.g., transitions from a lower bit '0' voltage to a higher bit '1', or vice versa) on transmission lines or data paths to save on power consumption. In certain embodiments of the techniques described herein, the power consumed may be independent of the data patterns communicated to the memory device. In certain embodiments of memory devices that use a 16 bit data bus, such as the DDR5 SDRAM device, quad pumped parallelizing circuitry may be used to reduce the 16 bit data bus to a phase separated set of 4 nibbles, where each nibble includes 4 bits of data. Each nibble may be binary-decoded to produce a "one-hot" 16 bit data pattern having only one binary '1' bit, thus reducing the 16-bit data bus to a phase separated set of 4 nibbles. Using a one-hot technique, a first set of N bits is decoded into a second set of $2^N$ bits where the second set of $2^N$ bits contains a single '1' and the remainder bits are all set to '0', hence the "one-hot" nomenclature. The one-hot data patterns may then be sent as signals over certain data transmission circuitry, (e.g., transmission lines, data channeling circuits, multiplexers, drivers, repeaters, and so on). Because the data is transmitted with a reduced number of binary '1' bits (e.g., a single binary '1' bit per nibble), the number of transitions is reduced, resulting in power savings. Indeed, in a 16 bit data bus, the worst case scenario may include at most 8 transitions.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK (e.g., signal 54). The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

The memory banks 12 may store data communicated via the I/O interface 16, as described above. In order to further reduce power consumption, the I/O interface 16 may include a one-hot communications interface 50 suitable for decoding/encoding, for example, the IO signals (e.g., DQ<15:8> and DQ<7:0>) for transmission via the data path 46 as one-hot signals. One or more corresponding one-hot communications interfaces 52 may also be disposed, for example, in the bank controls 22, and used for decoding/encoding the one-hot signals into data that may then be stored and/or retrieved from the memory banks 12. For example, during transmission of input data into one of the memory banks 12 for storage, the one-hot communications interface 50 may convert input signals into one-hot signals having a single '1' bit per 16-bit word. The one-hot signals may then be communicated via the data path 46 to the one-hot communications interface 52, which then convert the one-hot signals into data to be stored in the desired memory bank 12.

Likewise, for output data retrieved from the desired memory bank 12, the one-hot communications interface 52 may convert the data into one-hot signals, which may then be transmitted via the data path 46 into the one-hot communications interface 50. The one-hot communications interface 50 may then convert the one-hot signals into the output data for output via the I/O interface 16. As mentioned earlier, one-hot signals include a single binary '1' bit per data pattern (e.g., per nibble, per 16 bit byte, and so on). The one-hot signals communicated via the one-hot communications interfaces 50, 52 may include data patterns that have less transitions between zeroes and ones, thus reducing power consumed by the memory device 10. Indeed, the power consumed may be independent of the data patterns communicated via the I/O interface 16. It is to be noted that while the one-hot communications interface 52 is depicted as included in the bank controls 22, the one-hot communications interface 52 may be included in the data path 46 or near a terminus end of each transmission line. Likewise, the one-hot communications interface 50 may be included near a terminus end opposite of the one-hot communications interface 52, or in the data path 46.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
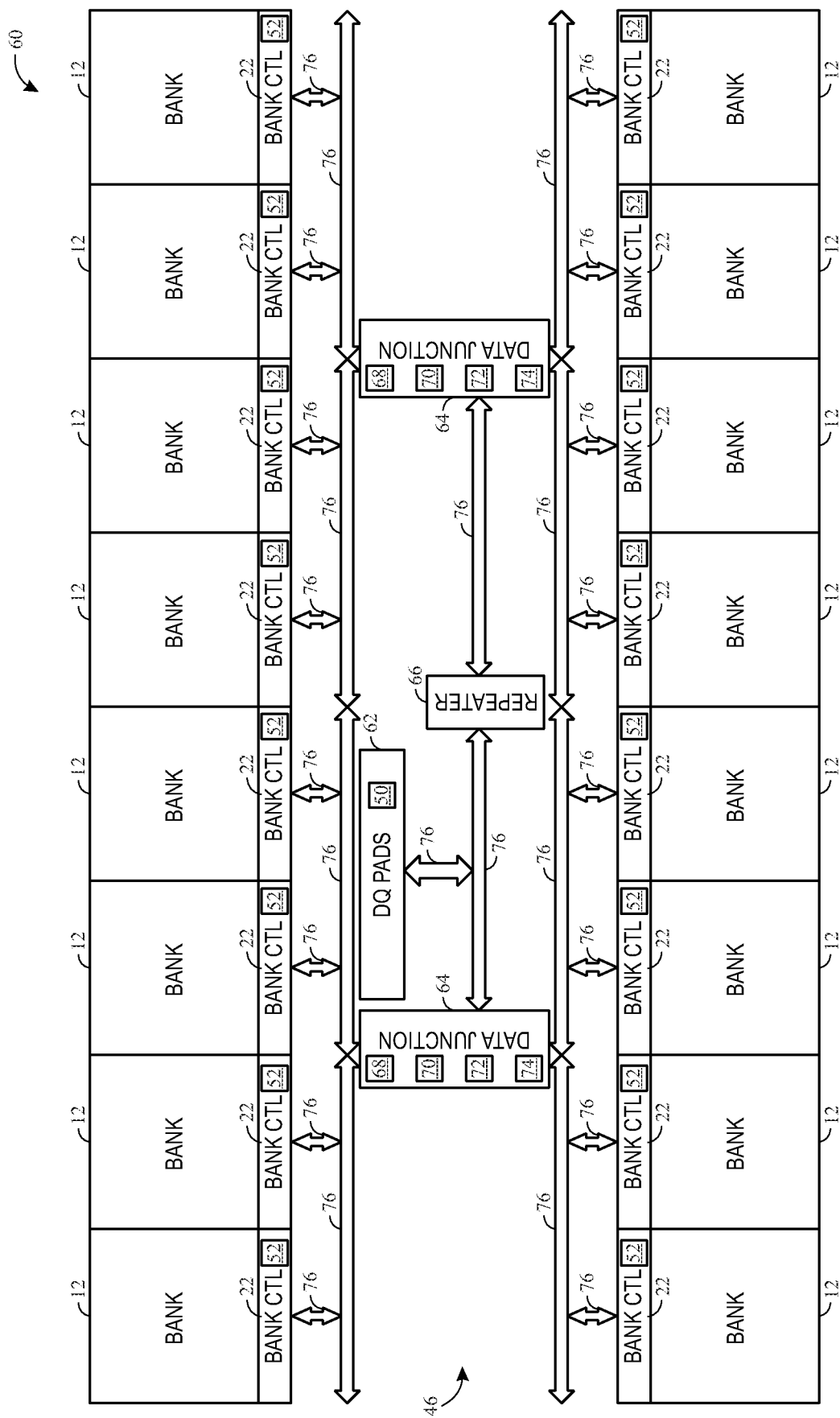
FIG. 2 is a block diagram illustrating an embodiment of a data path architecture suitable for lowering power consumption of the memory device shown in FIG. 1.

Turning now to FIG. 2, a block diagram illustrating an embodiment of a data path architecture 60 suitable for lowering power consumption of the memory device 10 is shown. Because the figure depicts like elements as those found in FIG. 1, the like elements are illustrated with like numbers. In the depicted embodiment, DQ pad(s) 62 may be used to communicate the 10 signals (e.g., DQ<15:8> and DQ<7:0> shown in FIG. 1) to external devices, such as processors, field programmable arrays (FPGAs), and so on. The data communicated via the DQ pad(s) 62 may be converted by the one-hot communications interface 50 for transmittal or for receipt as one-hot signals through the data path 46. The data path 46 is also shown communicatively coupled to one or more of the one-hot communications interfaces 52 disposed as part of the bank controllers 22. The DQ pads 62 may be included in the I/O interface 16 or communicatively connected to the I/O interface 16.

In the depicted embodiment, the data path 46 includes two data junctions 64 communicatively coupled to each other via a repeater 66. The data junctions 64 may channel data into/out of memory banks 12 during data transmission via the data path 46. Accordingly, each data junction 64 may include multiple systems, such as multiplexors 68, drivers 70, keepers 72, and other systems 74 as shown, suitable for data distribution.

The repeater 66 may be used to span longer distances in a die, for example, by boosting signals to forward the data from one data junction 64 to another data junction 64. The communicated data may thus traverse through one or more transmission lines 76 of the data path 46 into or out of the memory banks 12. During operations, transitions between binary '1' bits and binary '0' bits may use power, for example power in the repeater(s) 66, multiplexors 68, drivers 70, keepers 72, and other systems 74. Accordingly, data patterns that minimize a number of transitions between ones and zeros (or vice versa) may minimize power consumption, such as switching power consumption, repeater power consumption, coupling power consumption, and so on. The techniques described herein may use certain data pattern conversion techniques, as described in more detail below, to communicate via data patterns that have a reduced number of high to low (e.g., binary '1' to binary '0') or low to high (e.g., binary '0' to binary '1') transitions.

Figure 3:
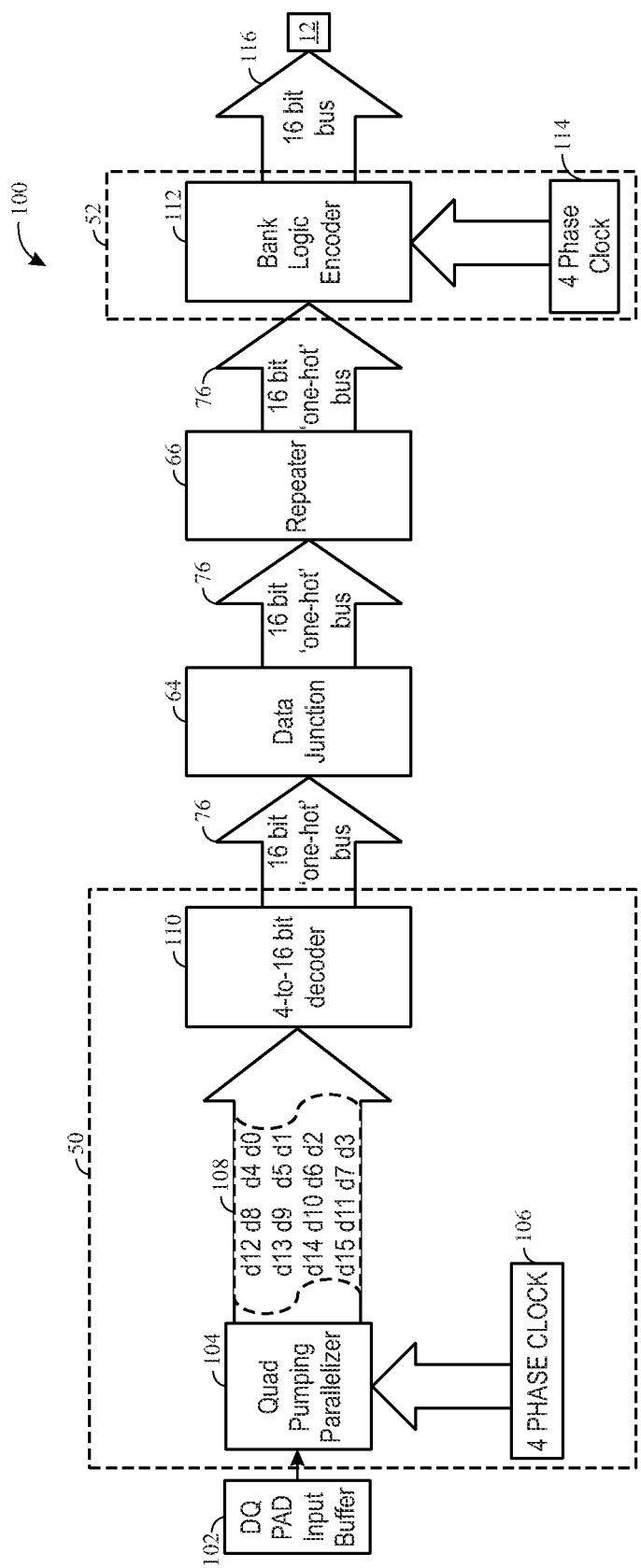
FIG. 3 is a diagram depicting an embodiment of a write process suitable for transmitting data from a one-hot communications interface to the memory bank of the memory device shown in FIG. 1.

For example, and turning now to FIG. 3, a block diagram of an embodiment of a write process 100 suitable for transmitting data from the one-hot communications interface 50 to one of the memory banks 12 is illustrated. Because the figure includes like elements to those found in FIGS. 1 and 2, the like elements are depicted with like numbers. In the depicted embodiment, a data input buffer 102, which may be included in the DQ pad 62, may store certain data. For example, the input buffer 102 may store one or more bytes, such as a 16-bit byte in cases where transmission lines 76 are 16-bit wide, for delivery to the memory banks 12. Data stored in the input buffer 102 may include a number of different data patterns. For example, $2^{16}$ data patterns may be possible in cases when the input buffer 102 stores 16-bit data. As mentioned earlier, data patterns that have many transitions may result in higher power consumption as data signals traverse to and from the memory banks 12. To improve power consumption, the process 100 may first use a quad pumping parallelizer circuitry 104 and a 4-phase clock 106 included in the one-hot communications interface 50 to convert the input buffer 102 data into 4 phase-separated nibbles of data 108. Each of the 4 phase-separated nibbles of data 108 contains 4 bits of the 16 bits found in the original data pattern and stored in the input buffer 102. Each of the nibbles of data 108 and may be separated in phase (e.g. timing separated) from each other by the 4-phase clock 106.

The process 100 may then use a one-hot decoder 110, such as a 4 to 16-bit one-hot decoder included in the one-hot communications interface 50 to convert each of the 4 phase-separated nibbles of data 108 from 4 bits into 16 bits. The conversion may use a decoding table as shown below to convert the data 108. More specifically, Table 1 shows all possible 4-bit data patterns (i.e., a total of $2^4$ data patterns) decoded into respective one-hot 16-bit patterns, where all of the 16-bit patterns have exactly one binary '1' bit. It is to be understood that other one-hot decoding tables may be used, having different decodings.

TABLE 1

| 4-bit data decoded into one-hot 16-bit data | |
|---|---|
| 4-bit Data Pattern | Decoded one-hot 16-bit Data Pattern |
| 0000 | 0000000000000001 |
| 0001 | 0000000000000010 |
| 0010 | 0000000000000100 |
| 0011 | 0000000000001000 |
| 0100 | 0000000000010000 |
| 0101 | 0000000000100000 |
| 0110 | 0000000001000000 |
| 0111 | 0000000010000000 |
| 1000 | 0000000100000000 |
| 1001 | 0000001000000000 |
| 1010 | 0000010000000000 |
| 1011 | 0000100000000000 |
| 1100 | 0001000000000000 |
| 1101 | 0010000000000000 |
| 1110 | 0100000000000000 |
| 1111 | 1000000000000000 |

As each of the 4-bit nibbles 108 arrives at the one-hot decoder 110, the one-hot decoder 110 may convert the 4 bits of data 108 into a one-hot 16-bit data pattern and then transmit the one-hot 16-bit data pattern via a transmission line 76. Accordingly, the transmission line 76 is now converted into operating as a 16-bit one-hot data bus. The one-hot 16-bit data may then traverse into one or more of the data junctions 64, and may also traverse the repeater 66 through transmission lines 76. one-hot encoding circuitry 112 may then receive the one-hot signals, e.g., 4 sets of phase-shift 16 bit transmissions (worst case), and encode the one-hot signals via Table 1 and via phase clock 114 to derive the original 16-bit data transmitted from the input buffer 102. The original 16-bit data may then be transmitted via 16-bit bus 116 and stored in the appropriate memory bank 12. It is to be understood that the techniques described herein may be used in data buses of various widths, such as 8-bit, 16-bit, 32-bit, 64-bit, 128-bit, or more, data buses.

For example, for 32-bit buses, a quintuple pumping parallelizer may use a 5-phase clock to send 5-bit data to a 5-to-32 bit one-hot decoder, and resulting one-hot signals may be encoded via a 32-bit one-hot encoder. It is also to be noted that multiple data paths may be used instead of the clock phasing to transmit the resulting one-hot signals, for example in parallel.

As it relates to power consumption, the best case transmission sequence occurs when no bits of the original data pattern switch between writes, and the worst case transmission sequence occurs when all bits of the original data pattern switch between writes. However, by using the write process 100, the number of transitions for the worst case would be 4 because the 4-phase nibbles resulting from the original data pattern would all have different values and thus the write process 100 would send four different one-hot 16-bit transmissions. When the 4-phase nibbles have the same value then a single one-hot transmission may be used in the write process 100 for the original data pattern.

However, the overall number of transitions between ones and zeros may be minimized, thus improving power consumption.

Figure 4:
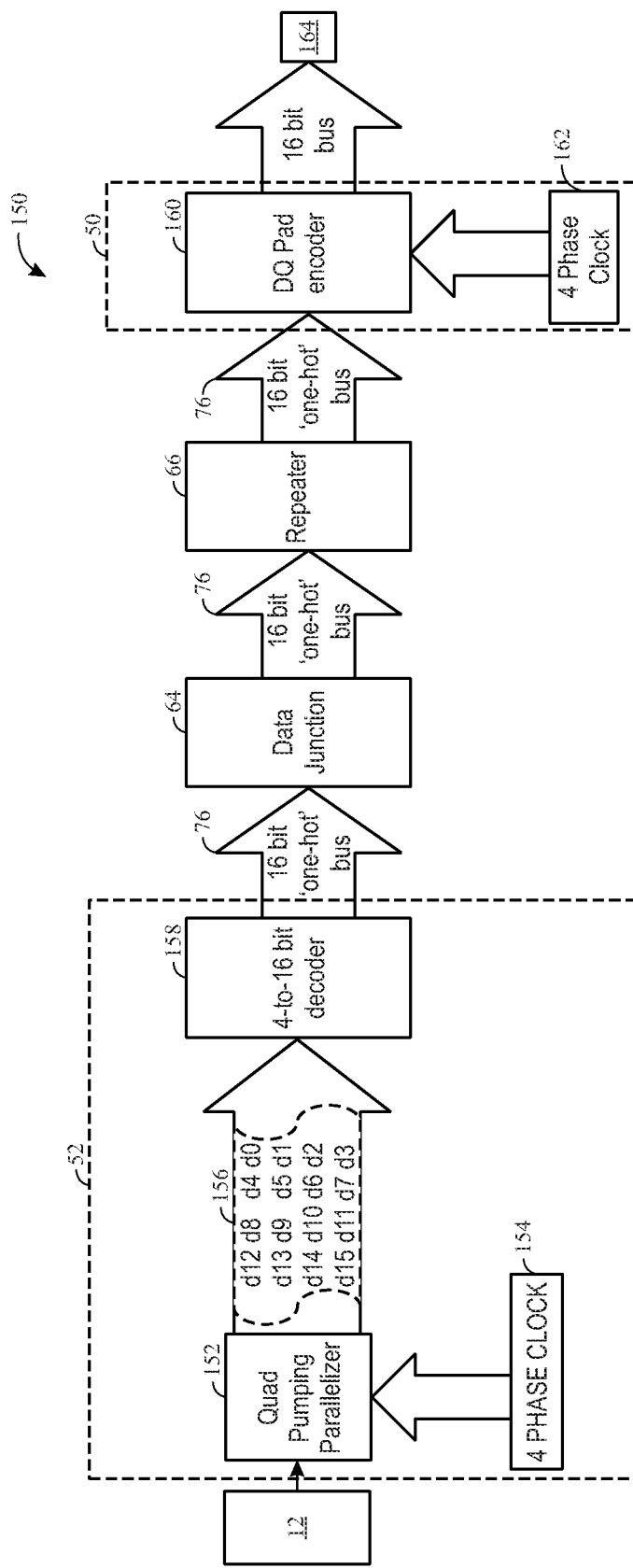
FIG. 4 is a diagram depicting an embodiment of a read process suitable for transmitting data from a memory bank to a one-hot communications interface of the memory device shown in FIG. 1.

FIG. 4 is a block diagram of a read process 150 suitable for reading data from the memory banks 12 and transmitting the data via one-hot signals. Because the figure includes like elements to those found in FIGS. 1, 2, and 3, the like elements are depicted with like numbers. In the depicted embodiment, each of the memory banks 12 may be communicatively coupled to a quad pumping parallelizer 152, which may be included in the one-hot communications interface 52. Similar to process 100, the data stored in the memory bank 12 may include a number of different data patterns, for example, 216 data patterns in cases when the memory bank 12 stores 16-bit data. As mentioned earlier, data patterns that have many transitions may result in higher power consumption as data signals traverse to or from the memory banks 12. To improve power consumption during memory read data transmissions, the process 150 may first use the quad pumping parallelizer circuitry 152 and a 4-phase clock 154 included in the one-hot communications interface 52 to convert memory bank 12 data into 4 phase-separated nibbles of data 156. Each of the 4 phase-separated nibbles of data 156 contains 4 bits of the 16 bits from the original data pattern stored in the memory bank 12, and may be separated in phase (e.g. timing separated) by the 4-phase clock 154.

The process 150 may then use a one-hot decoder 158, such as a 4 to 16-bit one-hot decoder included in the one-hot communications interface 52 to convert each of the 4 phase-separated nibbles of data 156 from 4 bits into 16 bits. The conversion may use a decoding table, such as Table 1 above, to convert the data 156. As each of the 4-bit nibbles 156 arrives, the one-hot decoder 158 may convert the 4 bits of data 156 into a one-hot 16-bit data pattern and then transmit the one-hot 16-bit data pattern via a transmission line 76. Accordingly, the transmission line 76 is now operating as 16-bit one-hot data bus. The one-hot 16-bit data may then traverse into one of the data junctions 64, and may also traverse the repeater 66 through transmission lines 76. one-hot encoding circuitry 160 may then receive the one-hot signals, e.g., 4 sets of phase-shift 16 bit transmissions (worst case), and encode the one-hot signals via Table 1 and phase clock 162 to derive the original 16-bit data transmitted from the memory bank 12. The original 16-bit data may then be delivered to system(s) 164 (e.g., processors, FPGAs, and so on) connected via the DQ pad 62 (shown in FIG. 2). As mentioned earlier, the read techniques described herein may be used in data buses of various widths, such as 8-bit, 16-bit, 32-bit, 64-bit, 128-bit, or more, data buses. For example, for 32-bit buses, a quintuple pumping parallelizer may use a 5-phase clock to send 5-bit data to a 5-to-32 bit one-hot decoder, and resulting one-hot signals may be encoded via a 32-bit one-hot encoder. It is also to be noted that multiple data paths may be used instead of the clock phasing.

Figure 5:
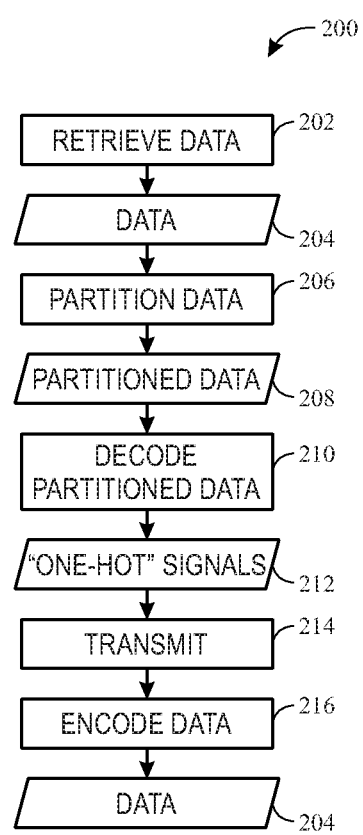
FIG. 5 is a flowchart illustrating an embodiment of a process for reading and/or writing data from/to the memory banks of the memory device of FIG. 1 via one-hot signals.

FIG. 5 is a flowchart of an embodiment of a process 200 suitable for reading and/or writing data from/to the memory banks 12 via one-hot signals. In the depicted embodiment, the process 200 may first retrieve (block 202) data 204, for example, from input buffer 102 for transmission to the memory bank 12 or from the memory bank 12 for transmission to external systems 164 (shown in FIG. 4). The data 204 may then be partitioned (block 206) into partitioned data 208, for example via phase-shifting the data 204 into 4 nibbles of 4 bits each. While phase-shifting is described as one technique for partitioning the data, other techniques may include having multiple paths for various bits in the data. For example, 4 transmission lines, each 4 bits wide, may also be used to derive the partitioned data 208. The partitioned data 208 may then be decoded (block 210) and transmitted as one-hot signals 212.

To decode (block 210) the partitioned data 208, a one-hot table may be used, suitable for deriving one-hot bit patterns based on the data 208. The table decoding may be implemented via multiplexer circuitry, custom circuitry, and the like, that may take bits of the partitioned data 208 as input and output the one-hot signals 212. The one-hot signals 212 may then be transmitted (block 214), for example via data busses (e.g., bus 76), data junctions 64, repeaters 66, and so on, either from the DQ pad 62 to the memory bank 12 or vice versa.

On a receiving end of the transmission, the one-hot signals 212 may be encoded (block 216) to derive the original data 204. For example, phase-shifting of the received one-hot signals 212 may be applied via circuitry suitable for converting the one-hot signals 212 into data that may include multiple binary '1' bits. The resulting original data 204 may then be stored in the memory bank 12 during a write operation or sent to external systems 164 (shown in FIG. 4) during a read operation.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A method, comprising:
receiving a write command at a memory device having a memory bank comprising a bank logic encoder circuit that is communicatively coupled to a data bus and to a phase clock;
converting, via the memory device, a first data pattern to be written in the memory bank of the memory device into first one-hot signals based on the write command;
transmitting, via the data bus of the memory device, the first one-hot signals to the bank logic encoder circuit of the memory device;
converting, via the bank logic encoder circuit, the first one-hot signals into the first data pattern, by deriving the first data pattern based on a plurality of nibbles arrived by partitioning the first data pattern; and
saving the first data pattern in the memory bank.

2. The method of claim 1, wherein partitioning the first data pattern comprises determining a number of bits in each nibble of the plurality of nibbles based on a data bus width.

3. The method of claim 2, wherein converting, via the memory device, the first data pattern comprises decoding the plurality of nibbles into the first one-hot signals based on a one-hot signal decoding table.

4. The method of claim 1, wherein transmitting, via the data bus of the memory device, the first one-hot signals comprises the first one-hot signals traversing a data junction of the memory device, a repeater of the memory device, or a combination thereof.

5. The method of claim 1, comprising:
receiving a read command at the memory device;
converting, via the memory device, a second data pattern to be read from the memory bank of the memory device into second one-hot signals based on the read command;
transmitting, via the data bus of the memory device, the second one-hot signals from a first one-hot communications interface of the memory device;
converting, via a second one-hot communications interface, the second one-hot signals into the second data pattern; and
providing the second data pattern to an Input/Output (DQ) pad of the memory device.

6. The method of claim 5, wherein converting, via the second one-hot communications interface, the second one-hot signals into the second data pattern comprises decoding the second one-hot signals via a one-hot signal decoder circuitry.

7. A memory device, comprising:
a data path comprising a data bus;
a first one-hot communications interface communicatively coupled to the data bus;
at least one memory bank comprising a bank logic encoder circuit communicatively coupled to the data bus and to a phase clock; and
an input/output (I/O) interface communicatively coupled to the at least one memory bank via the first one-hot communications interface and the bank logic encoder circuit, wherein the first one-hot communications interface is configured to convert a first data pattern received by the I/O interface into one-hot signals transmitted via the data bus to the bank logic encoder circuit, and wherein the bank logic encoder circuit is configured to convert the one-hot signals into the first data pattern to be stored in the at least one memory bank, wherein the first one-hot communications interface comprises a pumping parallelizer circuitry configured to convert the first data pattern into one or more phase-separated nibbles of data and wherein the bank logic encoder circuit encodes the one or more phase-separated nibbles of data via the phase clock into the first data pattern.

8. The memory device of claim 7, wherein the one or more phase-separated nibbles of data comprise a clock-phased data that has been partitioned.

9. The memory device of claim 7, wherein the first one-hot communications interface comprises a decoder circuitry configured to receive the one or more phase-separated nibbles of data and configured to decode the one or more phase-separated nibbles of data into the one-hot signals.

10. The memory device of claim 9, wherein the data bus comprises a 16-bit data bus, wherein the pumping parallelizer circuitry comprises a quad pumping parallelizer circuitry configured to convert the first data pattern into 4 phase-separated nibbles of data, and wherein each of the 4 phase-separated nibbles of data comprises 4 bits.

11. The memory device of claim 1, wherein the bank logic encoder circuit is disposed in a memory bank controller of the memory bank.

12. The memory device of claim 1, wherein the data path comprises a first data junction; a second data junction communicatively coupled to the at least one memory bank; and a repeater, wherein the first and second data junctions are communicatively coupled to each other via the repeater, and wherein the one-hot signals are configured to be transmitted from the first one-hot communications interface to the first data junction via the data bus, then to the repeater, and then to the second data junction via the repeater to be stored into the at least one memory bank.

13. The memory device of claim 1, wherein the at least one memory bank is configured to convert a second data pattern stored in the at least one memory bank into second one-hot signals transmitted to the first one-hot communications interface, and wherein the first one-hot communications interface is configured to convert the second one-hot signals into the second data pattern to be communicated to an external system via the I/O interface.

14. The memory device of claim 13, wherein at least one memory bank comprises a second pumping parallelizer circuitry configured to convert the second data pattern into one or more phase-separated nibbles of data, a decoder circuitry configured to receive the one or more phase-separated nibbles of data and configured to decode the one or more phase-separated nibbles of data into the second one-hot signals.

15. The memory device of claim 1, comprising a double data rate type five (DDR5) memory device having the data path, the first one-hot communications interface, the second one-hot communications interface, the at least one memory bank, and the I/O interface.

16. The memory device of claim 7, comprising a double data rate type five (DDR5) memory device having the first one-hot communications interface.

17. A memory device, comprising:
a first one-hot communications interface comprising:
a first pumping parallelizer circuitry configured to convert a first data pattern into one or more phase-separated nibbles of data by partitioning the first data pattern; and
a first decoder circuitry configured to receive the one or more phase-separated nibbles of data and configured to decode the one or more phase-separated nibbles of data into first one-hot signals, wherein the first one-hot communications interface is configured to transmit the first one-hot signals via a data bus for storage of the first data pattern in a memory bank of the memory device; and
a bank logic encoder circuit disposed in the memory bank of the memory device and communicatively coupled to the first one-hot communications interface via the data bus, wherein the bank logic encoder circuit encodes the one or more phase-separated nibbles of data via a phase clock into the first data pattern.

18. The memory device of claim 16, comprising:
a second one-hot communications interface disposed in the memory bank and comprising the bank logic first encoder circuit.

19. The memory device of claim 18, wherein the second one-hot communications interface comprises:
a second pumping parallelizer circuitry configured to convert a second data pattern stored in the memory bank into second one or more phase-separated nibbles of data; and
a second decoder circuitry configured to receive the second one or more phase-separated nibbles of data and configured to decode the second one or more phase-separated nibbles of data into second one-hot signals, wherein the second one-hot communications interface is configured to transmit the second one-hot signals via the data bus to an Input/Output (DQ) pad of the memory device.

20. The memory device of claim 19, wherein the first one-hot communications interface comprises a second encoder circuit configured to convert the second one-hot signals into the second data pattern for transmission of the second data pattern to the DQ pad.

* * * * *